(12) United States Patent
Iizuka

(10) Patent No.: US 7,238,958 B2
(45) Date of Patent: Jul. 3, 2007

(54) FAULT POSITION IDENTIFICATION SYSTEM FOR A SEMICONDUCTOR DEVICE AND METHOD OF IDENTIFYING A FAULT POSITION OF A SEMICONDUCTOR DEVICE

(75) Inventor: Yoshikazu Iizuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/052,850

(22) Filed: Feb. 9, 2005

(65) Prior Publication Data

US 2005/0229063 A1    Oct. 13, 2005

(30) Foreign Application Priority Data

Apr. 7, 2004    (JP)    ............................ P2004-113051

(51) Int. Cl.
*G01N 21/86*    (2006.01)
(52) U.S. Cl. ................. 250/559.29; 250/559.4

(58) Field of Classification Search ........... 250/559.29, 250/559.4, 559.33, 559.45, 221; 324/765, 324/763, 501
See application file for complete search history.

(56) References Cited

U.S. PATENT DOCUMENTS 6,553,546 B1    4/2003    Murakami
6,995,564 B1 *  2/2006    Ang et al. .................. 324/501

* cited by examiner

*Primary Examiner*—Que T. Le
(74) *Attorney, Agent, or Firm*—Finnegan, Henderson, Farabow, Garrett & Dunner, L.L.P.

(57) ABSTRACT

A fault position identification system for a semiconductor device includes: a storage unit storing test data of the semiconductor device; a test result analyzer generating test parameters of the semiconductor device, based on failure information of a failure occurred in the semiconductor device; an emission controller controlling the semiconductor device to perform a circuit operation in which the failure occurs, by transmitting the test data corresponding to the test parameters to the semiconductor device; and an observation apparatus observing light emitted from a fault position and identifying the fault position.

20 Claims, 9 Drawing Sheets

FAULT POSITION IDENTIFICATION SYSTEM FOR A SEMICONDUCTOR DEVICE AND METHOD OF IDENTIFYING A FAULT POSITION OF A SEMICONDUCTOR DEVICE

CROSS REFERENCE TO RELATED APPLICATIONS AND INCORPORATION BY REFERENCE

This application is based upon and claims the benefit of priority from the prior Japanese Patent Applications No. P2004-113051, filed on Apr. 7, 2004; the entire contents of which are incorporated herein by reference.

BACKGROUND OF THE INVENTION

1. Field of the Invention

The present invention relates to a fault position identification system for a semiconductor device and a method of identifying a fault position of a semiconductor device.

2. Description of the Related Art

Conventionally, in a fault position identification system for a semiconductor device, layout information including visual information specifying the location of a fault position candidate node is input to a fault position identification unit using a navigation tool. The visual information is provided on a layout display of a semiconductor device based, on a fault position candidate node list. Then, using an observation apparatus, an emission image having an area with a possible physical fault position in the semiconductor device is input to a fault position identification unit. A fault position is identified by combining the layout information and the emission image. Then, fault position information is output.

SUMMARY OF THE INVENTION

An aspect of the present invention inheres in a fault position identification system for a semiconductor device, including: a storage unit storing test data of the semiconductor device; a test result analyzer configured to generate light emission test parameters of the semiconductor device, based on failure information of a failure occurred in the semiconductor device; an emission controller configured to control the semiconductor device to perform a circuit operation in which the failure occurs, by transmitting the test data corresponding to the light emission test parameters to the semiconductor device; and an observation apparatus configured to observe light emitted from a fault position of the semiconductor device and to identify the fault position.

Another aspect of the present invention inheres in a method for identifying method of identifying a fault position of a semiconductor device, including: generating light emission test parameters of the semiconductor device, based on failure information of a failure occurred in the semiconductor device; controlling the semiconductor device to perform a circuit operation in which the failure occurs, by transmitting test data corresponding to the light emission test parameters to the semiconductor device; and identifying a fault position of the semiconductor device by observing light emitted from the fault position of the semiconductor device.

DETAILED DESCRIPTION OF THE INVENTION

Figure 1:
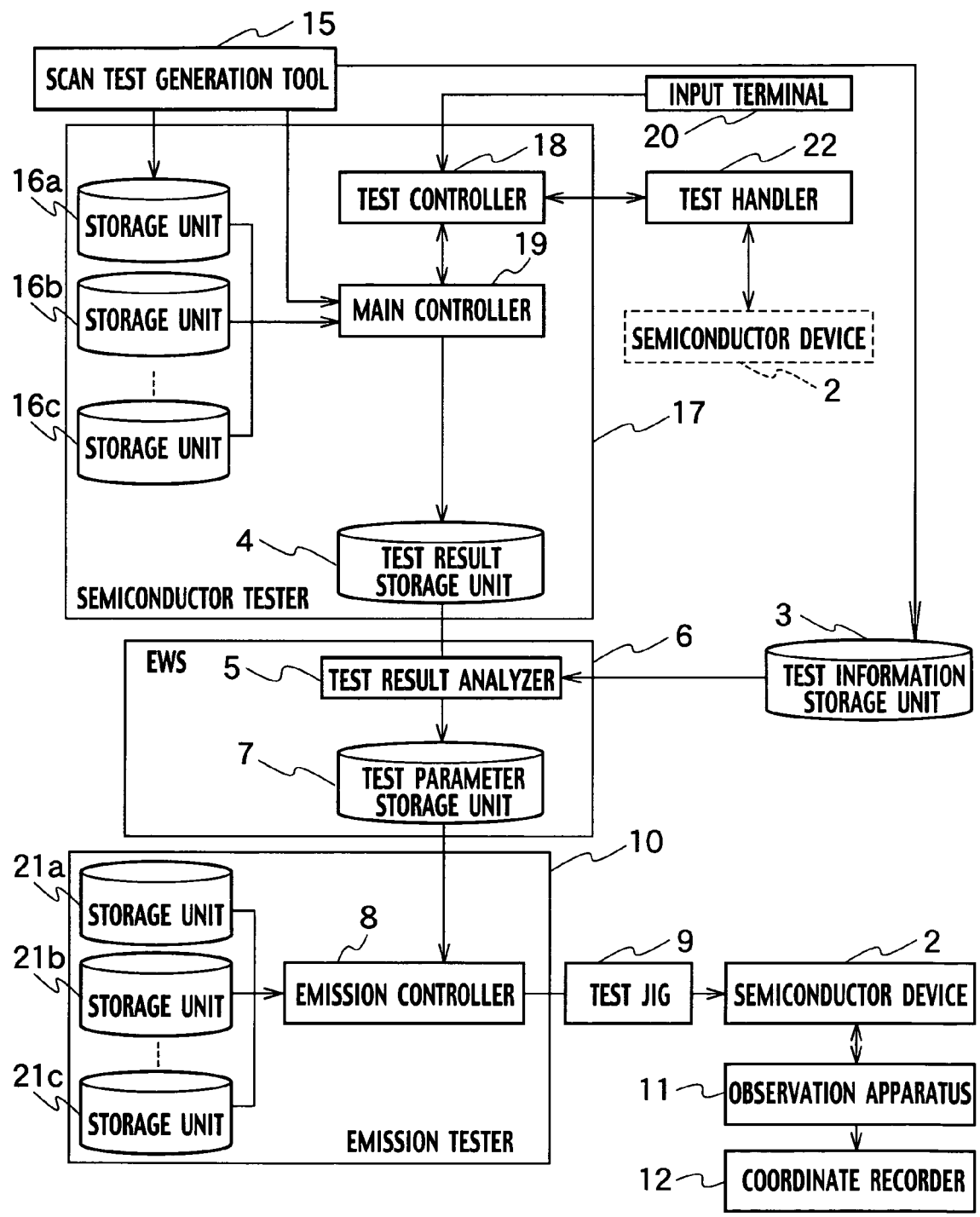
FIG. 1 is a block diagram showing a fault position identification system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

As shown in FIG. 1, a fault position identification system for a semiconductor device according to a first embodiment of the present invention, includes a test jig 9 connected to a semiconductor device 2, an observation apparatus 11 opposing the semiconductor device 2 to observe light emitted from a fault position of the semiconductor device 2, a coordinate recorder 12 connected to the observation apparatus 11 to record the light emission phenomenon corresponding to two-dimensional coordinates of the semiconductor device 2, and a light emission controller 8 connected to storage units 21a to 21c and to the test jig 9. The light emission controller 8 reads out test data corresponding to light emission test parameters from the storage units 21a to 21c, generates an emission observation test program and executes the emission observation test program.

The test jig 9 may comprise a plug in contact with a pin of the semiconductor device 2, a burn-in plug, a probe in contact with an electrode pad of the semiconductor device 2 or the like. The test jig 9 can provide arbitrarily selection of one of the electrical connection tools such as the plug, the burn-in plug and the probe, in accordance with the design of the fault position identification system.

The observation apparatus 11 may comprise an emission microscope for observing a surface of the semiconductor device 2. The observation apparatus 11 is not limited to an emission microscope. For example, a scanning charge-coupled device (CCD) camera or an area sensing CCD camera can be used as the observation apparatus 11.

The light emission test parameters include an input signal and scanning test data transmitted from scan-in pads representing the state of an internal circuit of the semiconductor device 2 when a failure occurs, and a number of scanning test steps executed in a period from a start time until the scanning test data is transmitted to a combinational circuit of the semiconductor device 2.

Since the fault position identification system obtains scanning test data when a failure has occurred in the semiconductor device 2, it is possible to skip the scanning test steps, and reproduce the failure state of the semiconductor device 2. Accordingly, it is possible to observe light emission for a short period of time, and thereby a fault position of the semiconductor device 2 can be identified at an early stage.

For example, the emission controller 8 executes an emission observation test program. The emission controller 8 retrieves test data, stored in the storage units 21*a*, 21*b* and 21*c*, as specified by the light emission test parameters from among the test data for testing multiple functions of the semiconductor device 2, and transmits the test data to an emission tester 10 for reproducing light emission.

The emission tester 10 reads all the retrieved data for testing all functions from the storage units 21*a*, 21*b* and 21*c*. The emission tester 10 generates an emission observation test program for skipping the number of test steps specified by the light emission test parameters. The emission tester 10 controls the emission controller 8 so as to execute the emission observation test program.

The emission controller 8 executes the emission observation test program. The emission controller 8 skips the normal test steps in which the semiconductor device 2 operates normally, and reproduces in less time, the state (operation) of the internal circuit of the semiconductor device 2 when a failure has occurred, along with the light emission. The emission controller 8 sets the internal circuit of the semiconductor device 2, which is to be observed, to the same logic state as when a failure has occurred and holds this circuit state so that light emitted from the semiconductor device 2 can be easily captured.

For example, the emission controller 8 allows the observation apparatus 11 to observe light emission due to a functional failure while holding the state of the internal circuit of the semiconductor device 2. The emission controller 8 controls reproduction of fault positions even without modifying the original semiconductor test program.

The observation apparatus 11 observes a surface of the semiconductor device 2 which is subjected to the observation of light emission. The emission observation test program allows reproduction of the state of the internal circuit of the semiconductor device 2 at the time of a failure. Thereby, it is possible to observe light emission for a short test time.

In the fault position identification system, the emission tester 10 avoids usage of an additional test program generation task that identifies when a failure of a semiconductor device 2 has occurred and keeps the internal state of the semiconductor device 2 the same as when a failure has occurred. Furthermore, the emission tester 10 retrieves, from the storage units 21*a* to 21*c*, a test program specified by the light emission test parameters, skips the test steps of the test program until reaching a time when a failure occurs, and observes the light emission in a short time. Thereby, it is possible to identify the fault position.

The fault position identification system sends emission observation test data to the semiconductor device 2, carries out a function test for a plurality of internal combinational logic circuits of the semiconductor device, and skips the test steps of the test program and observes light emission, thereby identifying a fault position.

The observation apparatus 11 observes the light emission of the semiconductor device 2 having a functional failure, and identifies the fault position. The emission tester 10 allows the observation apparatus 11 to observe the light emitted from the fault position in the semiconductor device 2 at a scanning test cycle period before data of the functional failure in semiconductor device 2 reaches the scan-out pads, and then identify the fault position.

In the fault position identification system, it is possible to pinpoint a fault position and also identify a fault position on a logic gate level. Therefore, reproduction of light emission can be carried out more accurately than the case of focusing on the fault position candidates using a logical simulator for analysis of a functional failure of the semiconductor device 2.

As shown in FIG. 1, a test parameter generation unit configured to generate light emission test parameters includes an engineering workstation (hereafter, called "EWS") 6 and a semiconductor tester 17.

The semiconductor tester 17 includes a test controller 18 connected to an input terminal 20, storage units 16*a* to 16*c* connected to a scanning test generation tool 15, and a main controller 19 connected to the storage units 16*a* to 16*c* and to the test controller 18. The test controller 18 is connected to the semiconductor device 2 via a test handler 22. The test handler 22 facilitates the testing of the semiconductor device 2 by the test controller 18.

The EWS 6 includes a test result analyzer 5 connected to the semiconductor tester 17 through a test result storage unit 4, and further connected to the scanning test generation tool 15 through a test information storage unit 3. The test result analyzer 5 correlates the failure information received from the semiconductor tester 17 to the scanning test information received from the scanning test generation tool 15 so as to analyze the chip test results of the semiconductor device 2 and generates light emission test parameters.

The failure information includes information of an output pad of the semiconductor device 2 at which a functional failure is detected, and test result information of the number of test steps since the start time of the test in which the functional failure has been detected. Alternatively, the scanning test information includes test data for the input and output pads of each combinational circuit divided by scanning design, the number of test steps per single cycle period for the scanning test, and test data execution order parameters.

In the semiconductor tester 17, information of the type of the semiconductor device 2, which is input from the input terminal 20, is sent to the main controller 19 via the test controller 18. The scanning test generation tool 15 generates a test program and test data. The test data is stored in the storage units 16*a* to 16*c*, and the test program is executed by the main controller 19. Using the test program, the main controller 19 reads out the test data stored in the storage units 16*a* to 16*c*, one by one, in accordance with a test sequence, and then sends the test data to the test controller 18.

The test controller 18 is connected to the semiconductor device 2 via the handler 22. The test controller 18 tests the semiconductor device 2 which is subjected to observation using test data. The test controller 18 then sends a test result as the failure information to the EWS 6 via the main controller 19 and the test result storage unit 4.

In the EWS 6, the test result analyzer 5 extracts light emission test parameters which identify a sequence in which a fault position emits light, based on the scanning test information and the failure information.

(Scanning Design)

Figure 2:
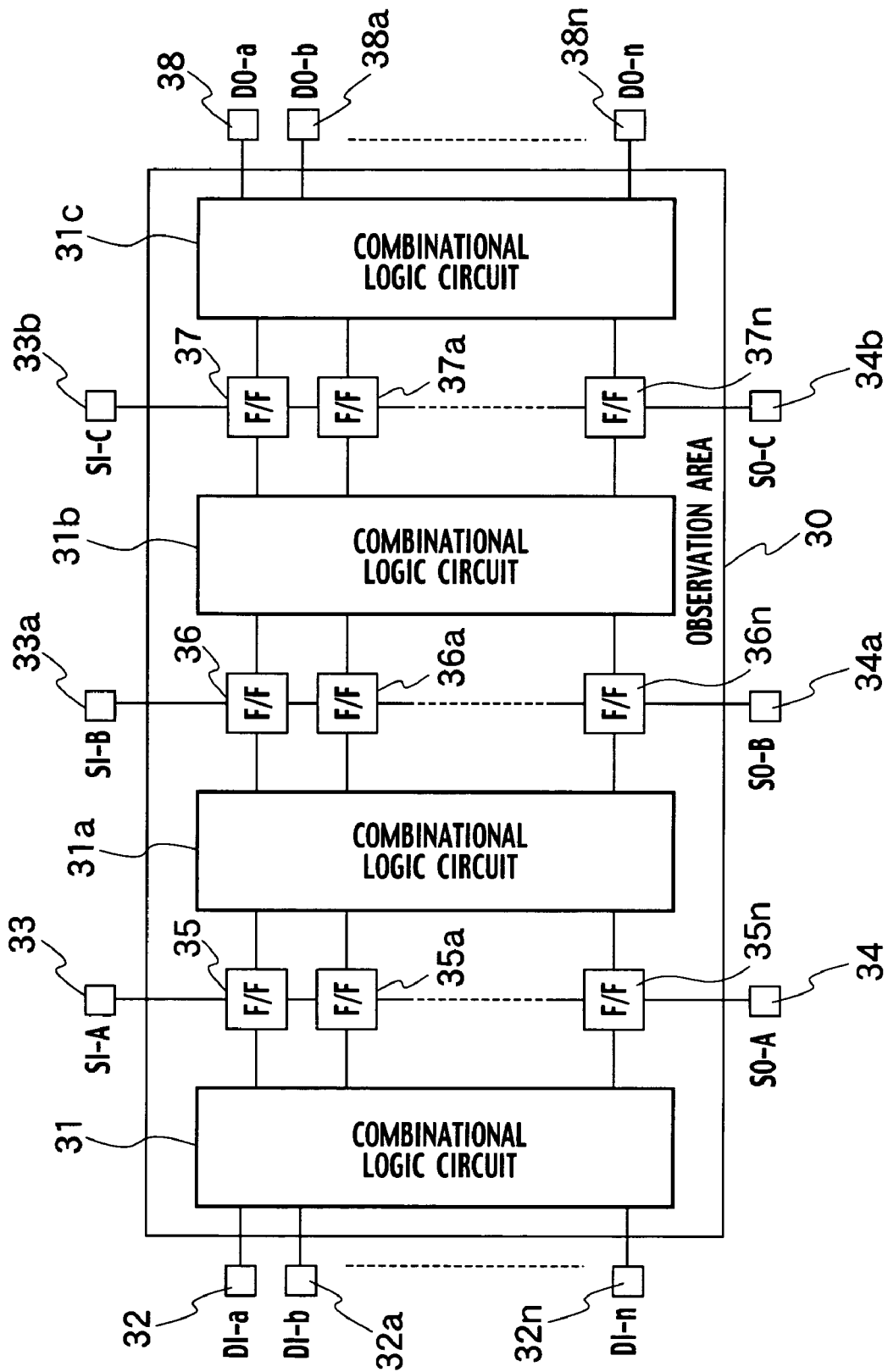
FIG. 2 is a block diagram showing a semiconductor device according to the first embodiment of the present invention.

As shown in FIG. 2, a semiconductor device designed for scanning includes an integrated circuit in which light emission is observed by the fault position identification system. The semiconductor device includes an observation area 30 in which light emission is observed, one to n input pads 32, 32a, . . . , and 32n to which input signals are input, one to n output pads 38, 38a, . . . , and 38n to which output signals are output, scan-in pads 33, 33a, and 33b which are scanning test pads, and scan-out pads 34, 34a, 34b, which are scanning test pads.

The semiconductor device includes a combinational logic circuit 31 connected to the input pads 32, 32a, . . . , and 32n; a combinational logic circuit 31c connected to the output pads 38, 38a, . . . , 38n, and combinational logic circuits 31a and 31b provided between the combinational logic circuits 31 and 31c.

One to n flip-flops 35, 35a, . . . , and 35n are provided between the combinational logic circuit 31 and the combinational logic circuit 31a. The flip-flop 35 is connected to the scan-in pad 33, and the flip-flop 35n is connected to the scan-out pad 34. One to n flip-flops 36, 36a, . . . , and 36n are provided between the combinational logic circuit 31a and the combinational logic circuit 31b. The flip-flop 36 is connected to the scan-in pad 33a, and the flip-flop 36n is connected to the scan-out pad 34a. One to n flip-flops 37, 37a, . . . , and 37n are provided between the combinational logic circuit 31b and the combinational logic circuit 31c. The flip-flop 37 is connected to the scan-in pad 33b, and the flip-flop 37n is connected to the scan-out pad 34b.

Next, operation of a scanning test will be described referring to FIGS. 1 and 2. The semiconductor tester 17 shifts scanning test data SI-A from the scan-in pad 33 to the flip-flop 35 (in the drawing, flip-flops are abbreviated as "F/F"s). The scanning test data is transferred from the flip-flop 35 to chain-linked flip-flops 35a, . . . , and 35n, serially input in the same shift cycle period.

The semiconductor tester 17 shifts in scanning test data SI-B from the scan-in pad 33a to the flip-flop 36. The scanning test data from the flip-flop 36 is transferred to chain-linked flip-flops 36a, . . . , and 36n, serially input in the same shift cycle period.

The semiconductor tester 17 shifts in scanning test data SI-C from the scan-in pad 33b to the flip-flop 37. The scanning test data from the flip-flops 37 is transferred to the chain-linked flip-flops 37a, . . . , and 37n, serially input in the same shift cycle period.

Then, the semiconductor tester 17 transfers to a capture cycle period. The combinational logic circuit 31 inputs signals DI-a, DI-b, . . . , and DI-n from the input pads 32, 32a, . . . , and 32n. The logical calculation results (hereafter, called 'test results') are then stored in the flip-flops 35, 35a, . . . , and 35n.

The semiconductor tester 17 allows the combinational logic circuit 31a to input scanning test data SI-A from the flip-flops 35, 35a, . . . , and 35n in the capture cycle period. The test results are stored in the flip-flops 36, 36a, . . . , and 36n.

The semiconductor tester 17 allows the combinational logic circuit 31b to input scanning test data SI-B from the flip-flops 36, 36a, . . . , and 36n in the capture cycle period. The test results are stored in the flip-flops 37, 37a, . . . , and 37n.

The semiconductor tester 17 allows the combinational logic circuit 31b to input the scanning test data SI-C from the flip-flops 37, 37a, . . . , and 37n in a capture cycle period. The test results are then output as output signals DO-a, DO-b, . . . , and DO-n to the output pads 38, 38a, . . . , and 38n.

The semiconductor tester 17 transfers to a shift cycle period. The flip-flops 35, 35a, . . . , and 35n stored with the test results of the combinational logic circuit 31 are shifted, and one to n test results are output as an output signal SO-A to the scan-out pad 34 via the flip-flop 35n.

In a shift cycle period, the semiconductor tester 17 allows the flip-flops 36, 36a, . . . , and 36n with the test results of the combinational logic circuit 31a stored therein to shift, and one to n test results are then output as an output signal SO-B to the scan-out pad 34a via the flip-flop 35n.

In a shift cycle period, the semiconductor tester 17 allows the flip-flops 37, 37a, . . . , and 37n with the test results of the combinational logic circuit 31b stored therein to shift, and one to n pieces of test data are then output as an output signal SO-C to the scan-out pad 34b via the flip-flop 37n.

Next, operation of the fault position identification system will be described referring to timing charts shown in FIGS. 1 to 3.

Figure 3:
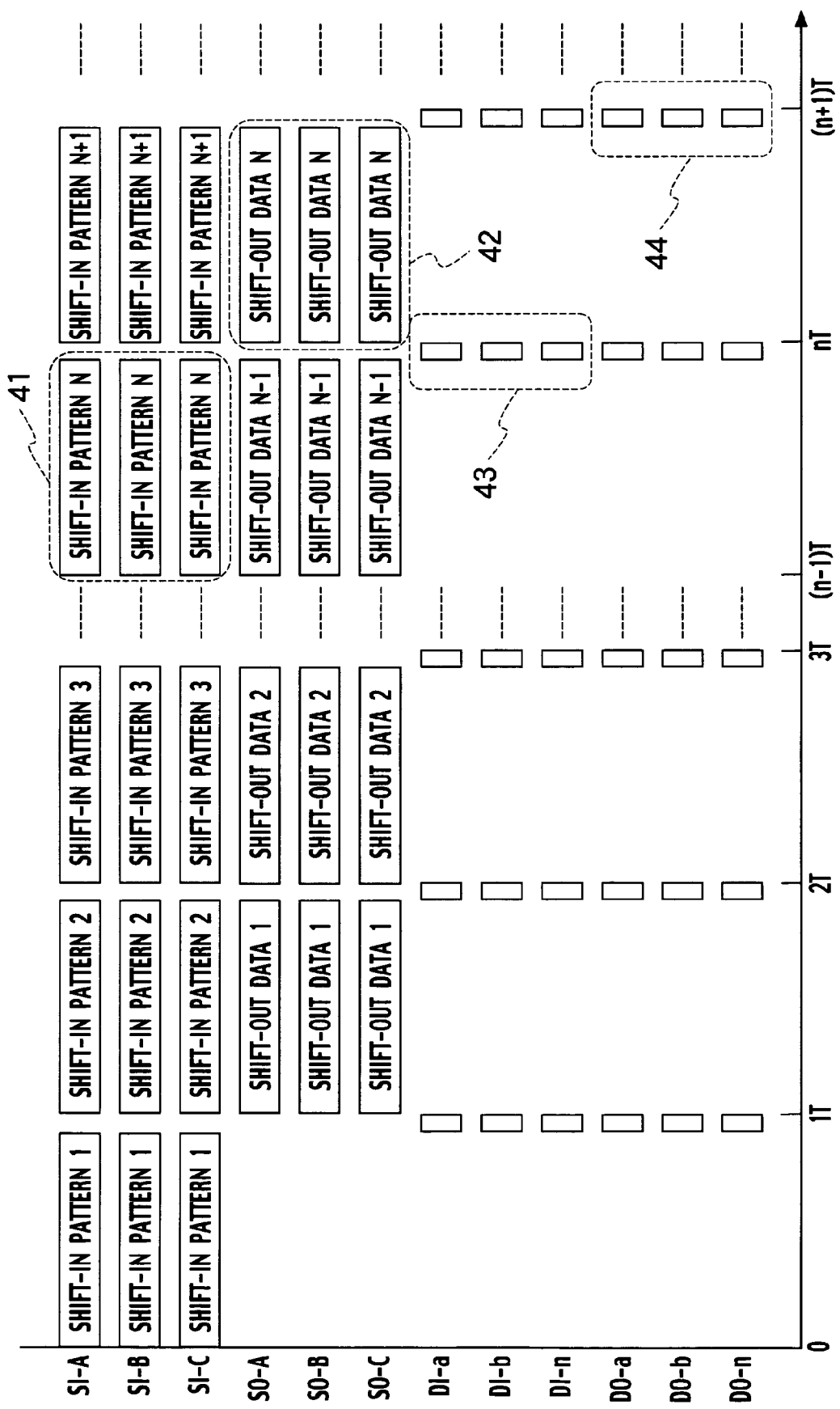
FIGS. 3 and 4 are timing charts for explaining a test of the semiconductor device according to the first embodiment of the present invention.

In the timing chart shown in FIG. 3, the vertical axis represents the pin names for respective signal names SI-A, SI-B, SI-C, SO-A, SO-B, SO-C, DI-a, DI-b, . . . , DI-n, DO-a, DO-b, . . . , and DO-n in the semiconductor device 2, while the horizontal axis represents time, and thus the chronological order of the scanning test is shown. TIME T represents a single cycle period for the scanning test. However, the present invention is not limited to a single cycle period, and TIME T may represent a longer cycle period than the single cycle period.

The semiconductor tester 17 shown in FIG. 1 allows the combinational logic circuits 31a, 31b and 31c to shift in scanning test data SI-A, SI-B and SI-C, respectively, during one to (n+1) cycle periods T, 2T, 3T, . . . , nT, and (n+1)T, and output the captured and output test results as output signals SO-A, SO-B and SO-C.

The semiconductor tester 17 allows the flip-flops 35, 36 and 37 to simultaneously shift in scanning test data SI-A, SI-B and SI-C from the scan-in pads 33, 33a and 33b in time slots 41 just before the nT cycle period, which requires n cycle periods in all.

The semiconductor tester 17 allows the combinational logic circuit 31 to simultaneously input signals DI-a, DI-b, . . . , and DI-n from the input pads 32, 32a, . . . , and 32n in time slots 43 of time nT.

The semiconductor tester 17 shifts out as output signals SO-A, SO-B and SO-C the test results of the combinational logic circuits 31, 31a and 31b from the scan-out pads 34, 34a and 34b in n cycle periods of time slots 42 between times nT and (n+1)T.

The semiconductor tester 17 allows the test results of the combinational logic circuit 31c to be output as output signals DO-a', DO-b', . . . , and DO-n' to the output pads 38 to 38n in time slots 44 of time (n+1)T.

Next, the operation of the fault position identification system will be described referring to FIGS. 1, 2 and 4. Regarding the same elements of the scanning test as the elements shown in FIG. 3, duplicative explanation is omitted.

Figure 4:
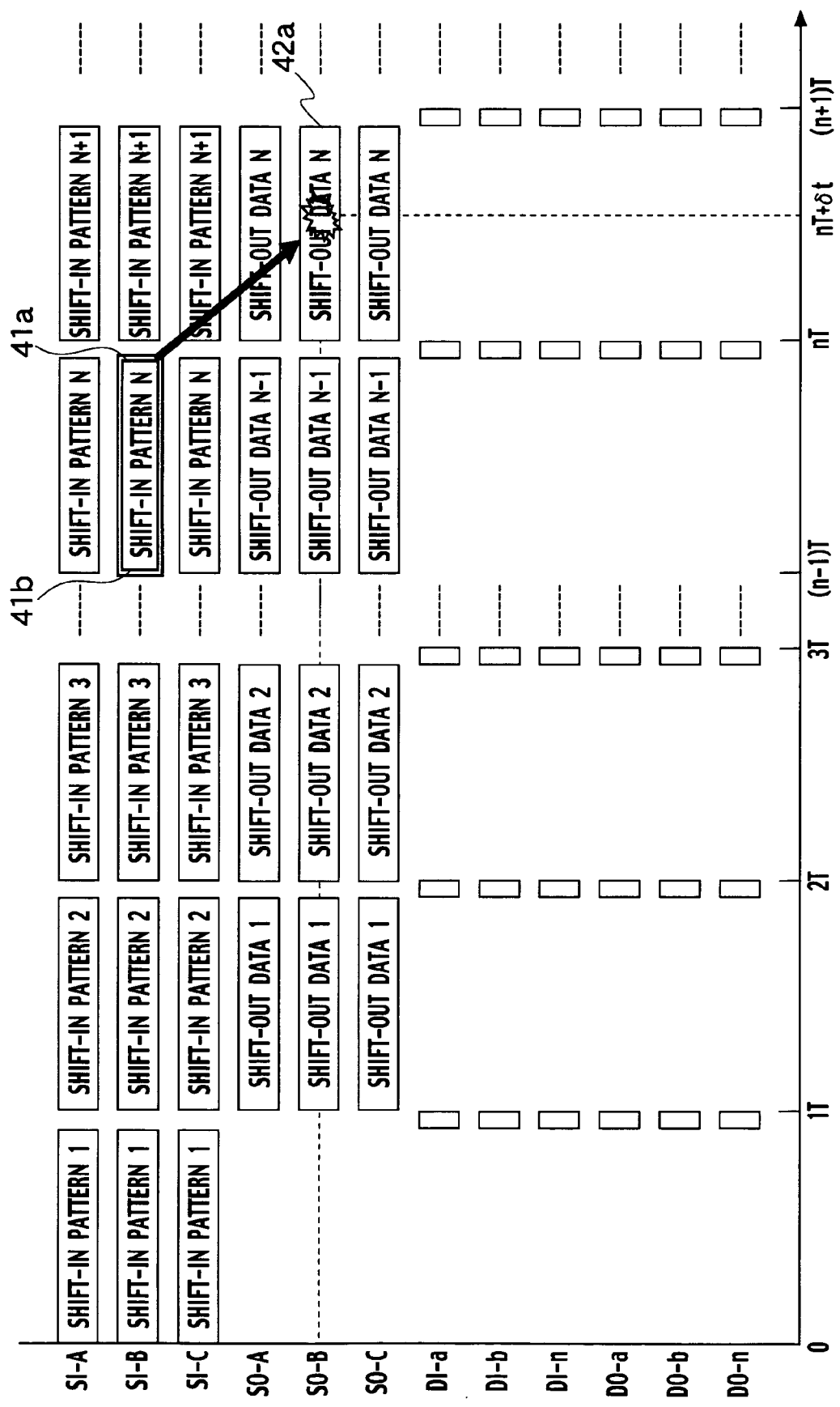

FIG. 4 chronologically shows a pin name SO-B at which a failure is detected by the scanning test, a time slot 41b in which test data n is serially input, a time slot 41a in which test data n is input to the combinational logic circuit, and a mark indicating a fault position identified in a cycle period of a shift-out time slot 42a.

The semiconductor tester 17 shown in FIG. 1 determines that an output signal 39 output to the scan-out pad 34a at time nT+dt is a failure, and then writes the scanning test data to the failure information.

The semiconductor tester 17 allows the flip-flop 35 to input scanning test data SI-A in time slot 41b, the flip-flops 35, 35a, . . . , and 35n to shift the scanning test data SI-A, and the flip-flops 35, 35a, . . . , and 35n to input n pieces of the scanning test data SI-A. Afterwards, in time slot 41a, the process proceeds to the capture cycle period, and at the time when the combinational logic circuit 31a inputs scanning test data SI-A, light is emitted.

Therefore, the light emission ends in a shift-out 42a cycle period. An actual failure occurs and subsequent light is emitted when transfer to a capture cycle period of time slot 41a.

The test result analyzer 5 of test parameter generation unit generates light emission test parameters, which are used to identify a capture cycle period of time slot 41a in which light emission has occurred, based on the failure information and the scanning test information.

Figure 5:
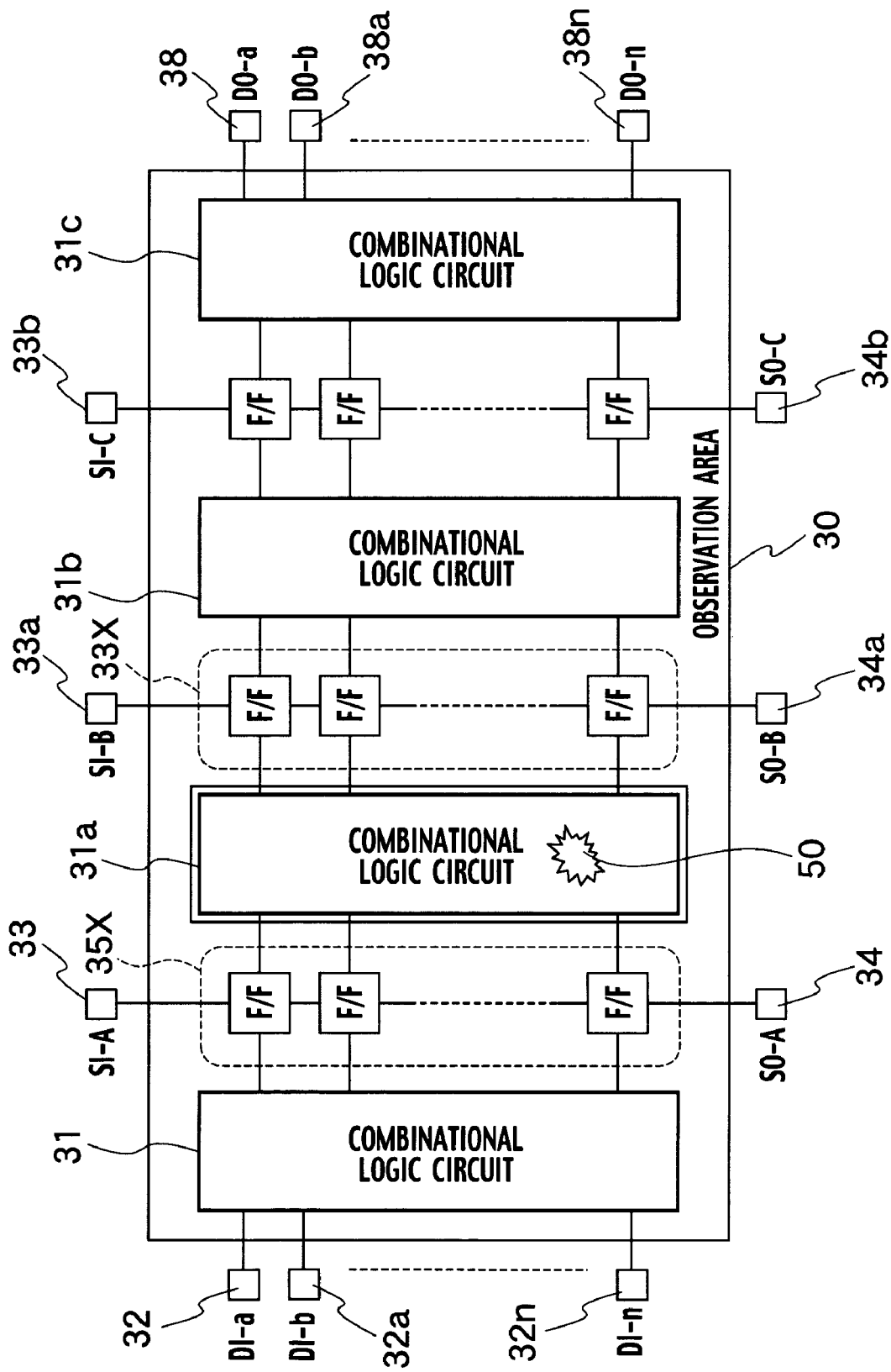
FIG. 5 is another block diagram showing the semiconductor device according to the first embodiment of the present invention.

FIG. 5 shows that light emission occurred at the actual fault position corresponding to the time slot when the failure occurs, as shown in FIG. 4, and the time slot when failure is detected. Observation of light emission in the observation area 30 of the semiconductor device means that the light is emitted from in the combinational logic circuit 31a.

As shown in FIG. 5, the semiconductor tester 17 shifts in the scanning test data SI-A to the scan-in pad 33, setting one to n pieces of scanning test data to a group of scanning flip-flops 35X provided on the input side of the combinational logic circuit 31a. Then, transferring to a capture cycle period in which part of the combinational logic circuit 31a emits light. The logic circuit at the light emission point is a failure.

The observation apparatus 11 shown in FIG. 1 captures an image of the observation area 30 in the semiconductor device 2 in the capture cycle period, and sends image data including light emission to the coordinate recorder 12.

The coordinate recorder 12 correlates the observation area 30 with X-Y coordinates. The coordinate recorder 12 sets a threshold for the coordinates of the light emission to a higher value than the threshold for the observation area 30, and records the coordinates of the light emission two-dimensionally for the semiconductor device 2 by using a recording device such as a magnetic disk, memory, printer or the like.

The semiconductor tester 17 allows a group of scanning flip-flops 33X to capture the outputs of the combinational logic circuit 31a, shifts the output to the scan-out pad 34a and compares the output signal SO-B with an expected value. As a result, a failure is detected.

According to the fault position identification system, the observation apparatus 11 can identify a fault position of a functional failure and correlate the fault position with two-dimensional coordinates of the semiconductor device 2.

Typically, when the semiconductor device 2 is subjected to failure analysis, the fault position of a functional failure in the two-dimensional coordinates can be pinpointed and analyzed. Thereby, it is possible to decrease the amount of work and time as compared to conventional systems.

Next, the operation of the fault position identification system will be described referring to FIGS. 1 and 6.

In step S51, the semiconductor tester 17 carries out a scanning test of the semiconductor device 2 using the test data from the storage unit 16a to 16c, and generates failure information.

In step S52, the test result analyzer 5 analyzes chip test results, based on the scanning test information from the scan test generation tool 15 via a test information storage unit 3 and the failure information of a failure occurred from the semiconductor tester 17 via the test result storage unit 4. The test result analyzer 5 then generates light emission test parameters including test data for the semiconductor device 2 and test cycle periods in which light emission occurred in the semiconductor device 2.

In step S53, the emission tester 10a controls a semiconductor device 2 to perform a circuit operation in which the failure occurs. The light emission test parameters from the test parameter storage unit 7 are transmitted to the emission tester 10, by amount associated with the number of test steps executed in a period from a start time of inputting the test data to semiconductor device 2 until the failure occurs. An emission observation test program is generated using the test data for the semiconductor device 2 specified by the light emission test parameters. A function test for the semiconductor device 2 is executed by running the test jig 9 in a test cycle period in which light is emitted.

In step S54, the observation apparatus 11 observes light emission that occurred at the fault position in the semiconductor device 2, and correlates the light emission coordinates to two-dimensional coordinates of the semiconductor device 2, and stores the light emission coordinates.

Note that in the semiconductor test of step S53, while reading a wafer ID and light emission test parameters from the storage unit 51, the emission controller 8 can control the semiconductor device 2 to emit light.

According to the fault position identification system, the emission controller 8 executes the emission observation test program to reproduce the timing of light emission at the fault position in the semiconductor device 2 at an early stage. Therefore, it is possible to identify a fault position in the semiconductor device 2 in a short time.

SECOND EMBODIMENT

Figure 7:
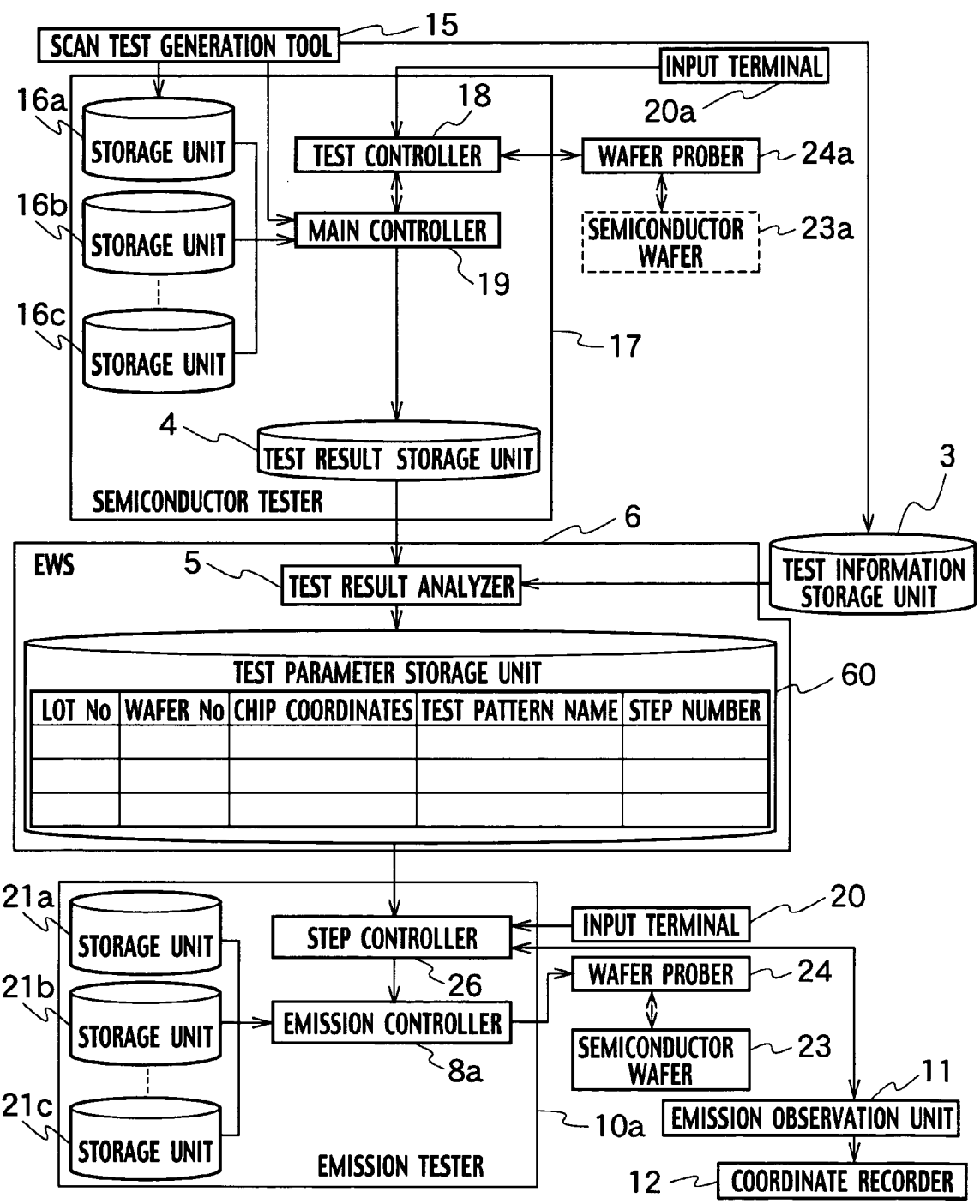
FIG. 7 is a block diagram showing a fault position identification system according to a second embodiment of the present invention.

As shown in FIG. 7, a fault position identification system according to a second embodiment of the present invention is different from the fault position identification system of the first embodiment in that a semiconductor wafer is subjected to a test instead of the single semiconductor device. Note that a description of the elements common to the fault position identification system is omitted.

The fault position identification system includes a wafer probe 24 which is a connecting unit connected to the semiconductor wafer 23, an observation apparatus 11 provided opposing the semiconductor wafer 23, in order to observe light emission at a fault position in the semiconductor wafer 23, a coordinate recorder 12 connected to the observation apparatus 11 so as to correlates light emission to two-dimensional coordinates of the semiconductor wafer 23 and records the two-dimensional coordinates, and an emission controller 8a connected to the storage units 21a to 21c and to the wafer probe 24 to read test data corresponding to light emission test parameters (wafer identification information) from the storage units 21a to 21c and executes the generated emission observation test program.

An emission tester 10a includes a step controller 26 connected to an emission controller 8a, an input terminal 20 and an observation apparatus 11, and storage units 21a to 21c connected to the emission controller 8a.

The emission controller 8a is connected to the wafer probe 24 so as to execute an emission observation test for the semiconductor wafer 23 via the wafer probe 24. The fault position identification system sends emission observation test data to the semiconductor wafer 23 and is capable of carrying out a scanning test; conducts a function test for combinational logic circuits in the semiconductor device, which is mapped with chip coordinates of the semiconductor wafer 23; and identifies the position of light emission.

The observation apparatus 11 observes light emission due to functional failure of a combinational logic circuit in the semiconductor device, which is mapped with chip coordinates of the semiconductor wafer 23, and identifies the position of the developed failure.

The emission tester 10a allows the observation apparatus 11 to observe light emission occurring at the fault position of a combinational logic circuit in the semiconductor device mapped with chip coordinates of the semiconductor wafer 23. The observation occurs in a scanning test cycle period just before functional failure data developed in a combinational logic circuit of the semiconductor device reaches scan-out pads, identifying the fault position.

The fault position identification system is capable of pinpointing a fault position and identifying a logic gate level fault position. Therefore, there is an advantage in that reproducibility of light emission is higher than that in the case of focusing on the fault position candidates using a logic simulator for fault position analysis of functional failures.

The fault position identification system inputs the lot number and wafer number of the semiconductor wafer 23 from the input terminal 20 to the emission controller 8a via the step controller 26. The wafer probe 24 is deployed and the observation apparatus 11 with chip coordinates of the semiconductor wafer 23, and carries out a function test for the semiconductor wafer 23. The chip coordinates are specified by the step controller 26 based on wafer identification information.

The step controller 26 specifies the next chip coordinates if there are any, deploys the wafer probe 24 and the observation apparatus 11 with the next chip coordinates of the semiconductor wafer 23, and carries out a function test for the semiconductor wafer 23.

According to the fault position identification system, it is possible to carry out an emission observation test for multiple semiconductor devices formed in the semiconductor wafer 23.

As shown in FIG. 7, a test parameter generation unit (wafer identification information generation unit) configured to specific generate wafer identification information includes a semiconductor tester 17 and an EWS 6.

The semiconductor tester 17 sends lot numbers, which are representative records of processed multiple semiconductor wafers, and a single semiconductor wafer number to a main controller 19 via a test controller 18, from an input terminal 20a. A scanning test generation tool 15 generates a test program and test data. The test data is stored in storage units 16a to 16c and the storage unit 21a to 21c and the storage unit 16a to 16c respectively, and the test program is executed by the main controller 19. The test program conducts, sequent reading of test data stored in the storage units 16a to 16c according to a test sequence and sends the test data to the test controller 18.

The test controller 18 is connected to the semiconductor wafer 23 via the wafer probe 24a. The test controller 18 tests the observation subject semiconductor wafer 23 using the test data from the storage units 16a to 16c, and sends the test results as failure information to the EWS 6 via the main controller 19 and a test result storage unit 6.

Next, in the EWS 6, the test result analyzer 5 extracts wafer identification information based on the scanning test information from the test information storage unit 3 and the failure information from the test result storage unit 6. The wafer identification information includes lot numbers which are representative records of processed multiple semiconductor wafers including the semiconductor wafer 23, wafer number of the semiconductor wafer 23, the chip coordinates specifying the position of each of the semiconductor devices assigned on the semiconductor wafer 23, test data used to reproduce the state of the internal circuit at the time when a failure has occurred, the number of test steps from a start time of the test until the failure has occurred, information of output pads at which a failure has been detected, and related information.

A function test is carried out same as the function test in the first embodiment. For example, an emission observation test for the semiconductor wafer 23 is carried out by transferring scanning test data from the scan-in pads 33 of the semiconductor device shown in FIG. 5, to a group of scanning flip-flops 35X, observing light emission of the combinational logic circuit 31a by the observation apparatus 11 when a capture cycle period has been reached, and sending image data including the light emission to the coordinate recorder 12.

Figure 8:
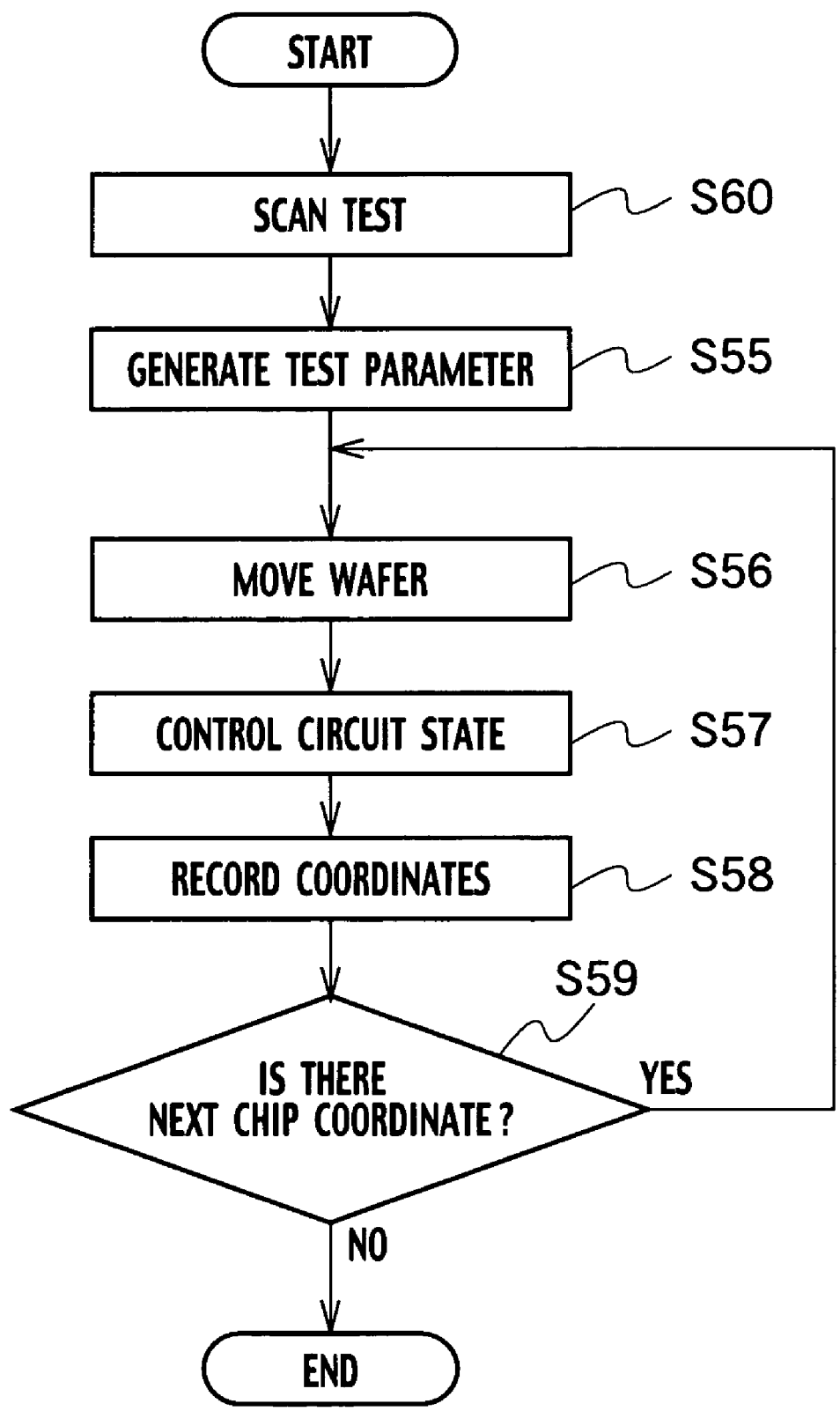
FIG. 8 is a flow chart showing a method of identifying a fault position of a semiconductor device according to the second embodiment of the present invention.

The operation of the fault position identification system will be described referring to FIGS. 7 and 8.

In step S60, the semiconductor tester 17 carries out a scanning test of each of the semiconductor devices assigned on the semiconductor wafer 23, using the test data from the storage unit 16a to 16c, and generates failure information.

In step S55, the test result analyzer 5 analyzes the chip test results each of the semiconductor devices, based on the scanning test information from the scan test generation tool 15 via a test information storage unit 3 and the failure information from the semiconductor tester 17 via the test result storage unit 4. The test result analyzer 5 then generates specific wafer identification information including test data for the semiconductor wafer 23 and data of a test cycle period when light is emitted in the semiconductor wafer 23.

In step S56, the emission tester 10a executes a step operation control to input the wafer identification information via a test parameter storage unit 60 to the step controller 26, and moves the semiconductor wafer 23 step by step so that the wafer probe 24 and the observation apparatus 11 can be positioned in the chip coordinate system for the semiconductor wafer 23, as specified by the wafer identification information.

In step S57, the emission tester 10a controls the semiconductor devices. The emission tester 10a inputs of the wafer identification information to the emission controller 8a, generates an emission observation test program using the test data for the semiconductor wafer 23 specified by the wafer identification information, activates the wafer probe 24, and conducts a function test for the semiconductor wafer 23 in a test cycle period when light is emitted.

In step S58, the observation apparatus 11 observes light emission which occurred at a fault position of the semiconductor wafer 23, and maps the fault position in two-dimensional chip coordinates of the semiconductor wafer 23 and records the light emission coordinates.

In step S59, the fault position identification system determines whether the identification of the fault positions are executed on all of the semiconductor devices (chips) in the wafer identification information. If coordinates for the next chip exist, the fault position identification system executes between the step operation control in step S56 and the light emission coordinate recording in step S58. Otherwise, if coordinates for the next chip do not exist in the wafer identification information, the emission observation test is completed.

According to the fault position identification system according to the second embodiment of the present invention, it is possible to identify the fault position of a functional failure which corresponds to two-dimensional coordinates using the observation apparatus 11.

The fault position identification system is capable of moving the semiconductor wafer 23 step by step so that the wafer probe 24 and the observation apparatus 11 can be positioned in multiple chip coordinates of the semiconductor wafer 23, as specified by the step controller 26 according to the wafer identification information, and efficiently obtains the emission observation test results. Therefore, the emission observation test can be provided for semiconductor device yield analysis as well as single semiconductor device fault analysis.

Accordingly, the emission observation test can be also provided not only for semiconductor wafer yield analysis but also for yield analysis of the processed multiple semiconductor wafers including an individual semiconductor wafer.

OTHER EMBODIMENTS

As described above, the present invention is described according to the embodiment. However, the description and drawings forming part of this disclosure should not be understood to limit the scope of this invention. This disclosure provides a variety of substitute embodiments, other embodiments, and implementation techniques for those skilled in the art.

Figure 9:
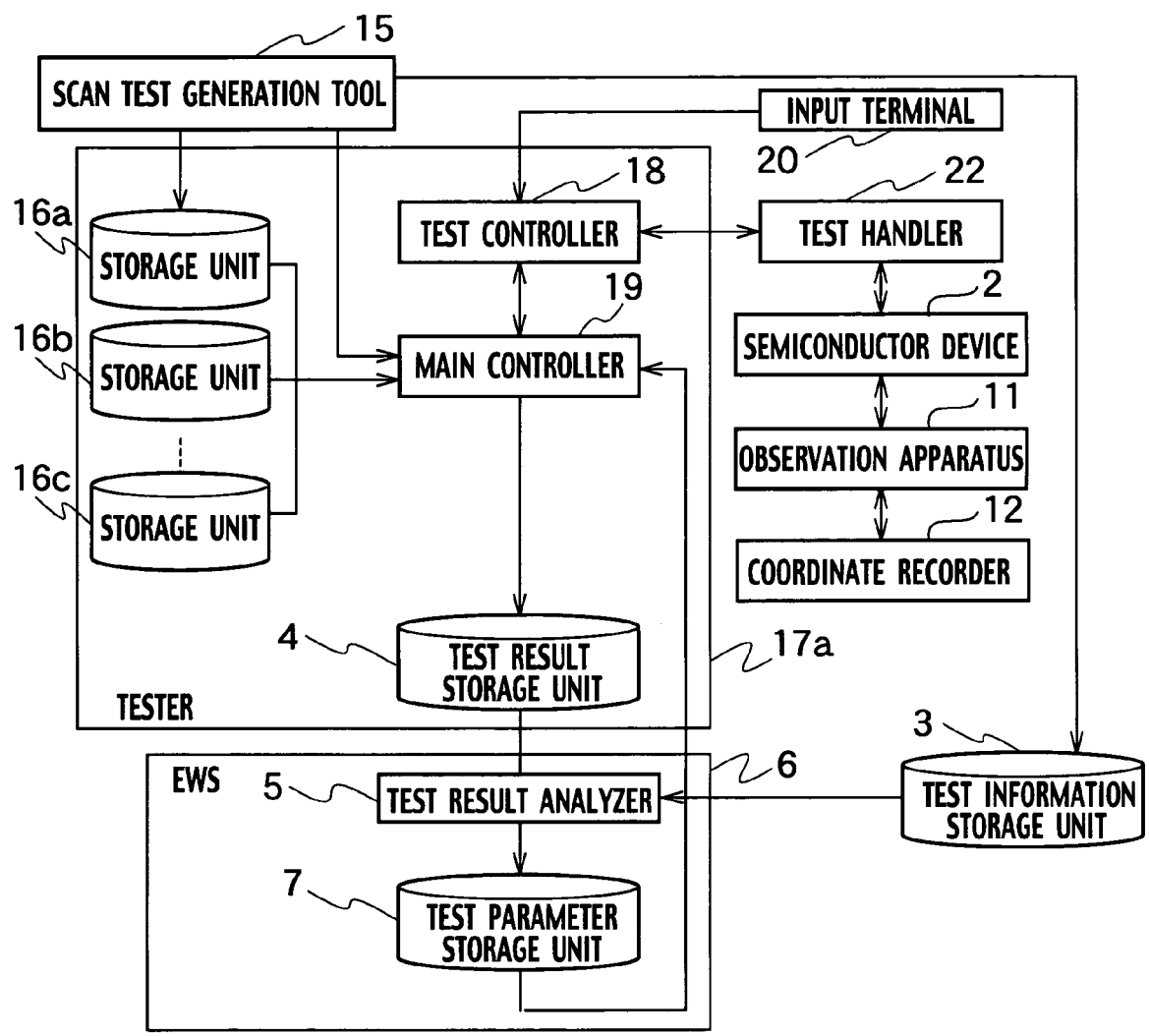
FIG. 9 is a block diagram showing a fault position identification system according to other embodiment of the present invention.

As shown in FIG. 9, the fault position identification system may include a single tester 17a. The tester 17a serves same as both the semiconductor tester 17 and the emission tester 10 shown in FIG. 1.

Figure 6:
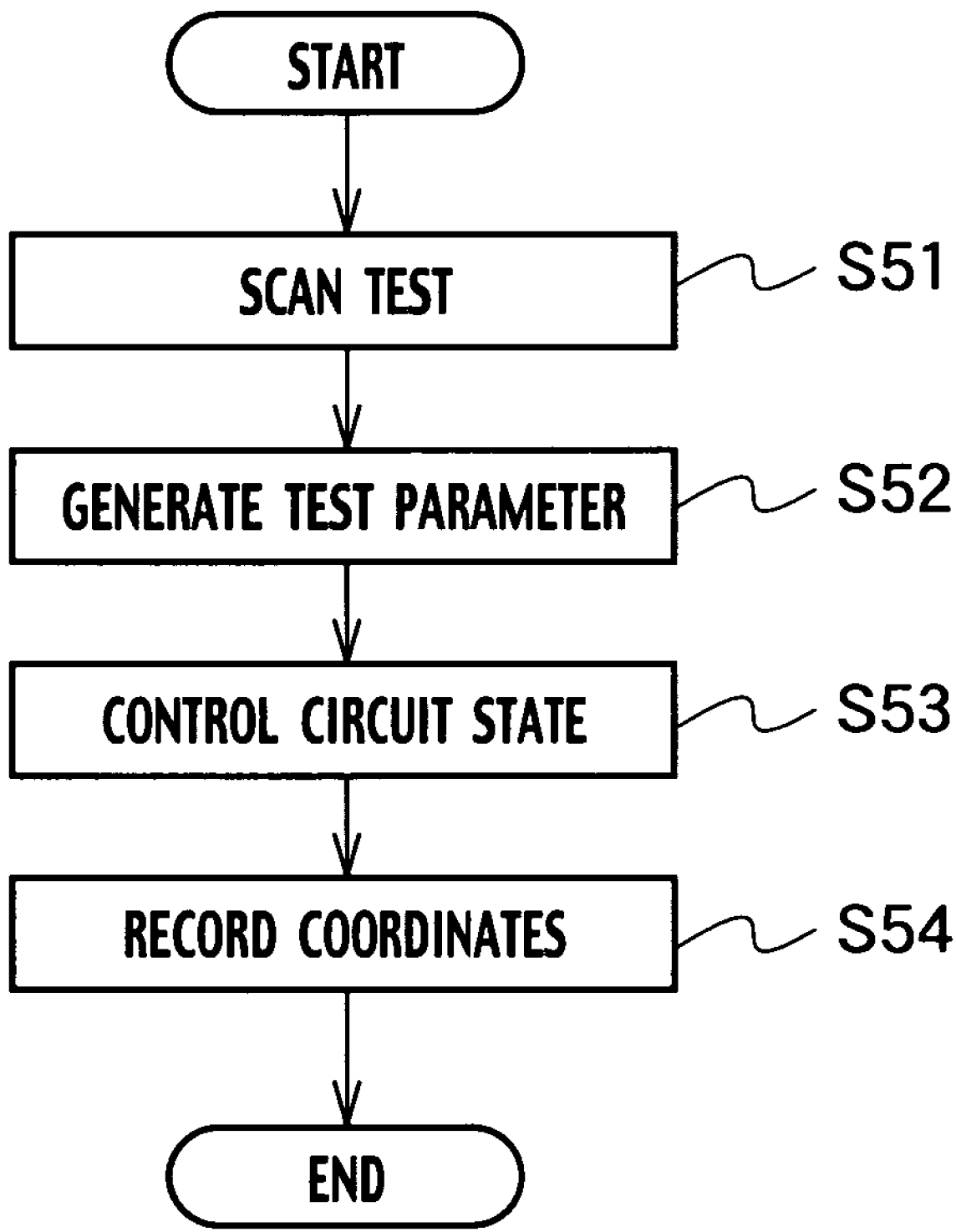
FIG. 6 is a flow chart showing a method of identifying a fault position of the semiconductor device according to the first embodiment of the present invention.

In step S51 of FIG. 6, the tester 17a carries out a scanning test of the semiconductor device 2 using the test data from the storage unit 16a to 16c, and generates failure information.

In step S52, the test result analyzer 5 analyzes chip test results, based on the scanning test information from the scan test generation tool 15 via a test information storage unit 3 and the failure information of a failure occurred from the tester 17a via the test result storage unit 4.

In step S53, the tester 17a also read the test data from the storage units 16a to 16c based on the light emission test parameters from the test parameter storage unit 7, and then controls a semiconductor device 2 to perform a circuit operation in which the failure occurs.

According to the fault position identification system shown in FIG. 9, it is possible to identify a fault position in the semiconductor device 2 in a short time same as the fault position identification system shown in FIG. 1.

According to the above description, it is apparent that the aforementioned embodiments may be used for semiconductor devices and semiconductor wafers. As such, the present invention naturally includes a variety of embodiments not described herein. Therefore, the technical scope of the present invention has to be defined by inventive matters specified by only the following claims of the invention, which is reasonable from the above descriptions.

What is claimed is:

1. A fault position identification system for a semiconductor device comprising:

a storage unit storing test data of the semiconductor device;

a test result analyzer configured to generate light emission test parameters of the semiconductor device, based on failure information of a failure occurred in the semiconductor device;

an emission controller configured to control the semiconductor device to perform a circuit operation in which the failure occurs, by transmitting the test data corresponding to the light emission test parameters to the semiconductor device; and an observation apparatus configured to observe light emitted from a fault position of the semiconductor device and to identify the fault position.

2. The fault position identification system of claim 1, further comprising a coordinate recorder configured to record coordinates at which the light emits, based on an observation result by the observation apparatus.

3. The fault position identification system of claim 1, further comprising a test controller configured to transmit the test data to the semiconductor device, and to obtain the failure information by detecting the failure based on an output result transmitted from the semiconductor device in accordance with the test data.

4. The fault position identification system of claim 1, wherein the failure information comprises:

information of an output pad of the semiconductor device at which the failure is detected; and a number of test steps executed in a period from a start time of transmitting the test data to the semiconductor device until the failure is detected.

5. The fault position identification system of claim 1, wherein the light emission test parameters comprise:

information of the test data transmitted to the semiconductor device; and a number of test steps executed in a period from a start time of transmitting the test data to the semiconductor device until the failure occurs.

6. The fault position identification system of claim 1, wherein the emission controller transmits the test data to the semiconductor device, by amount associated with the number of test steps executed in a period from a start time of inputting the test data to the semiconductor device until the failure occurs.

7. The fault position identification system of claim 1, wherein the test result analyzer generates specific light emission test parameters for each of the semiconductor devices assigned on a semiconductor wafer;

the emission controller controls each of the semiconductor devices to be in a specific circuit state in which the failure occurs, respectively; and the observation apparatus configured to observe the light emission from the semiconductor devices and to identify the fault position of each of the semiconductor devices.

8. The fault position identification system of claim 7, wherein the emission controller determines whether the identifications of the fault positions are executed on all of the semiconductor devices.

9. The fault position identification system of claim 7, wherein the failure information comprises:

information of an output pad of each of the semiconductor devices, at which the failure is detected;

a number of test steps transmitting the test data to each of the semiconductor devices executed in a period from a start time of transmitting the test data to each of the semiconductor devices until the failure is detected;

chip coordinates of each of the semiconductor devices assigned on the semiconductor wafer;

a lot number of the semiconductor wafer; and a wafer number of the semiconductor wafer.

10. The fault position identification system of claim 1, further comprising a scan test generation tool generating the test data.

11. The fault position identification system of claim 3, wherein the test controller performs a scan test of the semiconductor device provided by scan design.

12. A method of identifying a fault position of a semiconductor device comprising:

generating light emission test parameters of the semiconductor device, based on failure information of a failure occurred in the semiconductor device;

controlling the semiconductor device to perform a circuit operation in which the failure occurs, by transmitting test data corresponding to the light emission test parameters to the semiconductor device; and identifying a fault position of the semiconductor device by observing light emitted from the fault position.

13. The method of claim 12, further comprising recording coordinates at which the light emits, based on the observation result of the light emission.

14. The method of claim 12, further comprising:

transmitting the test data to the semiconductor device; and obtaining the failure information by detecting the failure based on an output result from the semiconductor device in accordance with the test data.

15. The method of claim 12, wherein the failure information comprises:

information of an output pad of the semiconductor device at which the failure is detected; and a number of test steps executed in a period from a start time of transmitting the test data to the semiconductor device until the failure is detected.

16. The method of claim 12, wherein the light emission test parameters comprise:

information of the test data transmitted to the semiconductor device in which the failure occurs; and a number of test steps executed in a period from a start time of transmitting the test data to the semiconductor device until the failure occurs.

17. The method of claim 12, wherein controlling the semiconductor device comprises, transmitting the test data to the semiconductor device by amount associated with the number of test steps executed in a period from a start time of inputting the test data to the semiconductor device until the failure occurs.

18. The method of claim 12, wherein generating specific light emission test parameters for each of the semiconductor devices assigned on a semiconductor wafer;

controlling the semiconductor device comprises, controlling each of the semiconductor devices; and identifying the fault position comprises, observing the light emitted from each of the semiconductor devices.

19. The method of claim 18, further comprising determining whether the identification of the fault positions is executed on all of the semiconductor devices are identified.

20. The method of claim 18, wherein the failure information comprises:

output pad numbers of each of the semiconductor devices at which the failure is detected;

a number of test steps transmitting the test data executed in a period from a start time of transmitting the test data to each of the semiconductor devices until the failure is detected;

chip coordinates of each of the semiconductor devices assigned on the semiconductor wafer;

a lot number of the semiconductor wafer; and a wafer number of the semiconductor wafer.

* * * * *